(12) United States Patent
Marshall et al.

(10) Patent No.: US 8,033,684 B2
(45) Date of Patent: Oct. 11, 2011

(54) STARRY SKY LIGHTING PANELS

(75) Inventors: Joseph A. Marshall, Lake Forest Park, WA (US); Gregory W. Nelson, Everett, WA (US); Bradley J. Mitchell, Snohomish, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 11/848,467

(22) Filed: Aug. 31, 2007

(65) Prior Publication Data
US 2009/0059609 A1 Mar. 5, 2009

(51) Int. Cl.
*F21V 21/00* (2006.01)
(52) U.S. Cl. ............... 362/249.02; 362/235; 362/249.04
(58) Field of Classification Search ............... 362/33, 362/97, 227, 230, 231, 235, 236, 237, 244, 362/245, 249, 276.326, 327, 330, 354, 355, 362/457, 470, 471, 479, 488, 490, 540, 543, 362/544, 545, 800, 802, 806, 812, 249.01, 362/249.02, 249.08, 249.1, 249.11; 340/953–956, 340/815.45; 40/564, 565, 579–581
See application file for complete search history.

(56) References Cited

U.S. PATENT DOCUMENTS

| | | | |
|---|---|---|---|
| 4,164,008 A | 8/1979 | Miller et al. | |
| 4,345,308 A | 8/1982 | Mouyard et al. | |
| 4,953,066 A | 8/1990 | Schiffer | |
| 4,967,317 A | 10/1990 | Plumly | |
| 5,416,678 A | 5/1995 | Schabowski | |
| 5,424,924 A | 6/1995 | Ewing et al. | |
| 5,519,595 A | 5/1996 | Wang | |
| 5,557,150 A * | 9/1996 | Variot et al. | 257/787 |
| 6,040,618 A * | 3/2000 | Akram | 257/586 |
| 6,059,423 A | 5/2000 | Knopick | |
| 6,160,714 A * | 12/2000 | Green | 361/761 |
| 6,203,180 B1 * | 3/2001 | Fleischmann | 362/471 |
| 6,540,373 B2 | 4/2003 | Bailey | |
| 6,718,576 B1 | 4/2004 | Shih | |
| 6,764,196 B2 * | 7/2004 | Bailey | 362/147 |
| 6,817,123 B2 * | 11/2004 | Okazaki et al. | 40/452 |
| 6,914,267 B2 * | 7/2005 | Fukasawa et al. | 257/98 |
| 7,055,987 B2 * | 6/2006 | Staufert | 362/235 |
| 7,204,622 B2 * | 4/2007 | Dowling et al. | 362/471 |
| 7,443,678 B2 * | 10/2008 | Han et al. | 361/704 |
| 7,559,673 B2 | 7/2009 | Meerman et al. | |
| 2003/0059976 A1 * | 3/2003 | Nathan et al. | 438/106 |

(Continued)

FOREIGN PATENT DOCUMENTS

DE 198 11 076 9/1999

(Continued)

*Primary Examiner* — Hargobind Sawhney
(74) *Attorney, Agent, or Firm* — Haynes & Boone, LLP.

(57) ABSTRACT

A lighting panel capable of producing a "Starry Sky" lighting effect and which is easily retrofitted into existing aircraft includes a first substrate, a plurality of microminiature light sources, such as LEDs, mounted on an upper surface of the first substrate, a plurality of electrically conductive traces written on the upper surface of the first substrate so as to make electrical interconnections with respective leads of the light sources, a clear filler material surrounding each light source and tapering down to the upper surface of the first substrate so as to planarize it, and a flexible decorative film laminated over the upper surface of the first substrate and light sources, the decorative film containing a plurality of apertures therethrough, each corresponding in location to a respective light source.

10 Claims, 4 Drawing Sheets

U.S. PATENT DOCUMENTS

2004/0121326 A1 * 6/2004 Harari et al. ............... 435/6
2005/0007791 A1 1/2005 Helbach et al.
2007/0247842 A1 * 10/2007 Zampini et al. ............. 362/227
2008/0225553 A1 9/2008 Roberts et al.

FOREIGN PATENT DOCUMENTS

| | | |
|---|---|---|
| EP | 1 495 910 | 12/2005 |
| GB | 2211681 A * | 7/1989 |
| WO | WO 2004/102064 | 11/2004 |

* cited by examiner

STARRY SKY LIGHTING PANELS

BACKGROUND

This disclosure relates to interior lighting panels for passenger aircraft, in general, and in particular, to an improved aircraft ceiling mounted lighting panel adapted to display a starry nighttime sky effect.

Passenger aircraft that operate over long distances during the night typically include interior lighting arrangements that provide substantially reduced ambient light so that passengers can sleep comfortably, but which is still bright enough to enable those passengers who choose not to sleep to move about the cabin safely. For example, as illustrated in FIG. 1, some models of the Boeing 777 passenger jet incorporate ceiling panels 100 that incorporate light emitting diodes (LEDs) that are arranged so as to blink in random patterns against a gray or dark blue background, and which, in a reduced ambient light condition, gives the relaxing, soporific appearance of a starry nighttime sky, and hence, is referred to as a "Starry Sky" ceiling lighting arrangement.

FIG. 2 illustrates a conventional Starry Sky lighting panel 100 swung down along a long edge thereof to expose the complex discrete wiring and electrical components located on the back surface thereof. The existing arrangement uses Diehl Aerospace lenses, lens holders, hardwired LEDs, wire bundles deployed on individual standoffs, and discrete power conditioning and control components that are integrated in a relatively complicated manufacturing process to produce a panel that gives the desired effect. In a typical installation, the aircraft may contain about 70 such panels 100, each of which may be about 4-6 ft. long, 2-3 ft. wide, and contain about 70 or more LEDs.

The disadvantages and limitations of this prior art solution are that the method of producing the panel is costly and relatively heavy, requires intensive, ergonomically costly manual labor steps, takes up a relatively large volume behind the ceiling panels and is difficult to retrofit into existing aircraft.

In light of the foregoing, there is a need in the relevant industry for an aircraft ceiling lighting panel that provides a Starry Sky effect through a "solid state" method that does not use Diehl lenses, lens holders, wired LEDs and complex associated point-to-point wiring, reduces panel weight, volume, manual fabrication and assembly labor and cost, eliminates repetitive injuries, and which can easily be retrofitted into existing aircraft.

BRIEF SUMMARY

In accordance with the exemplary embodiments disclosed herein, aircraft ceiling lighting panels and methods for manufacturing them are provided that produce a starry nighttime sky effect by means of an arrangement that does not use Diehl lenses, lens holders, wired LEDs and associated point-to-point wiring, thereby reducing panel weight, volume, manual fabrication and assembly labor, repetitive injuries, and that provides lighting panels that are easily retrofitted to existing aircraft.

In one exemplary embodiment, a lighting panel, such as an aircraft interior ceiling lighting panel, comprises a first substrate, which may comprise a structural ceiling panel of the aircraft. A plurality of microminiature light sources, such as LEDs or OLEDS, are mounted on an upper surface of the first substrate. A plurality of electrically conductive traces is then formed over the upper surface of the first substrate so as to make electrical interconnections with the respective leads of the light sources. A clear filler material is disposed around each light source so as to taper down to the upper surface of the first substrate and thereby serve to planarize the surface, and a flexible decorative film is then laminated over the upper surface of the first substrate and light sources. The film contains a plurality of light apertures therethrough, each corresponding in location to a respective one of the light sources.

In another exemplary embodiment, a "Starry Sky" lighting appliqué for a vehicle interior panel comprises a first flexible substrate, a second flexible substrate having a plurality of openings therethrough and laminated to an upper surface of the first substrate so as to form a plurality of closed-bottomed recesses thereon, and a microminiature light source, such as an LED or an OLED, is disposed within each of the recesses and adhered to the first substrate by means of an adhesive. A plurality of electrically conductive traces are formed over the upper surface of the first substrate so as to make electrical interconnections with respective leads of each of the light sources, and a clear filler material is disposed in each of recesses so as to surround the light source therein and make an upper surface of the filler material and the light source approximately flush with an upper surface of the second substrate. A clear flexible film is laminated over the upper surface of the second substrate, and a flexible decorative film is laminated over the upper surface of the first substrate and the light sources. A plurality of light apertures is formed through the decorative film such that each light aperture corresponds in location to a respective one of the light sources.

A better understanding of the above and many other features and advantages of the Starry Sky ceiling panels of the present disclosure, together with the advantageous methods disclosed herein for making them, can be obtained from a consideration of the detailed description of some exemplary embodiments thereof below, particular if such consideration is made in conjunction with the appended drawings, wherein like reference numbers are used to refer to like elements in the respective figures thereof.

DETAILED DESCRIPTION

This disclosure relates to improved "Starry Sky" aircraft ceiling panel lighting systems and methods for manufacturing them. The novel lighting panels comprise a plurality of small light sources, viz., microminiature light emitting diodes (LEDs), or alternatively, organic light emitting diodes (OLEDs), together with control circuitry interconnected with conductive traces that are printed or otherwise formed directly onto an aircraft structural ceiling panel and/or to a lamination of flexible substrates that are then bonded to such a structural ceiling panel in the form of an appliqué therefor. The result is a Starry Sky lighting panel construction that is lighter, smaller, less expensive, and easier to retrofit to existing aircraft than existing Starry Sky lighting panel systems.

Figure 1:
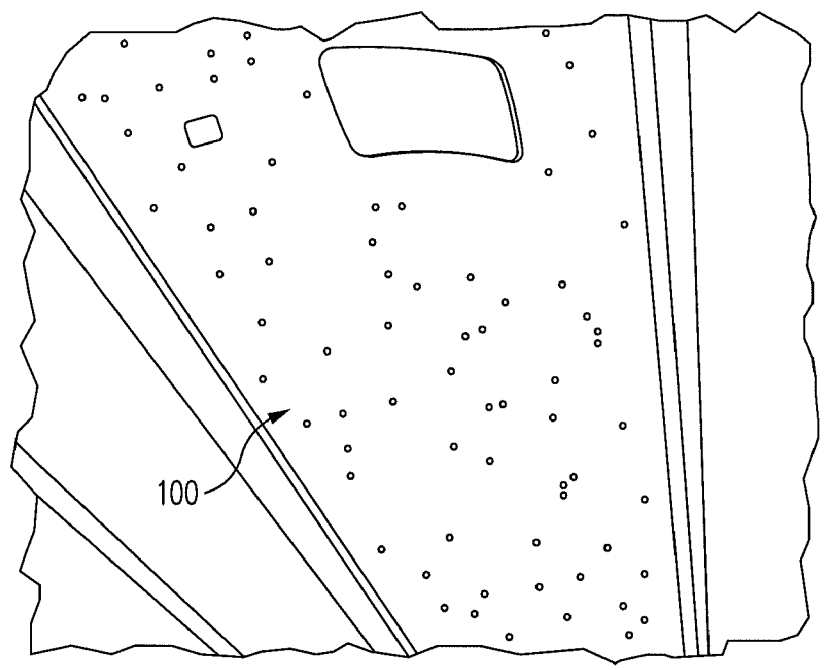
FIG. 1 is a perspective view, looking upward, of a Starry Sky aircraft ceiling lighting panel in accordance with the prior art.
Figure 2:
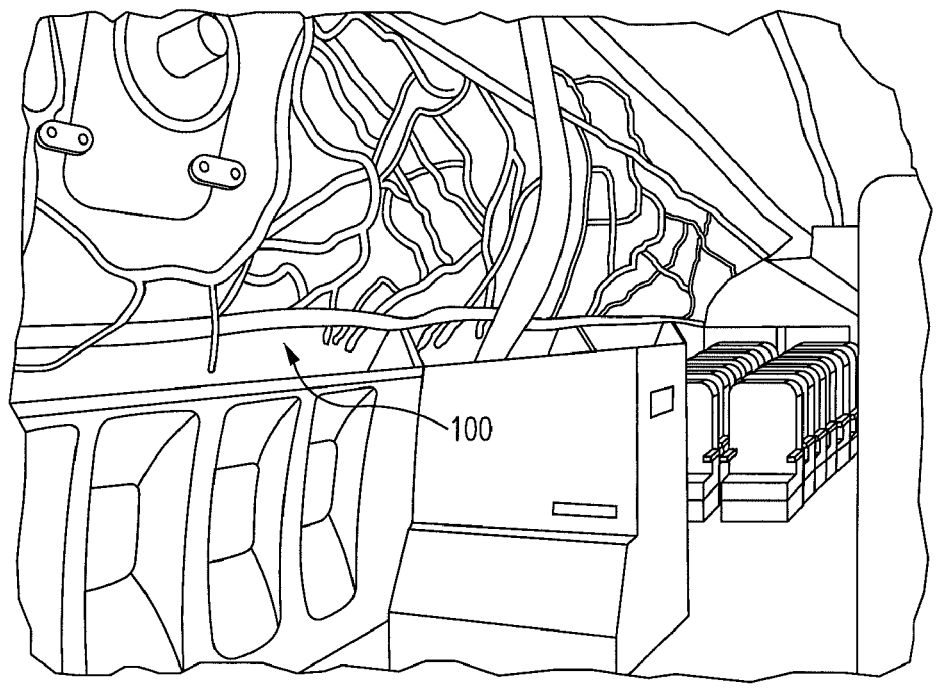
FIG. 2 is a perspective view of the prior art Starry Sky lighting panel of FIG. 1, shown swung down along a long edge thereof to expose the associated wiring and electrical power and control components disposed on the back surface thereof.

The novel panels achieve the foregoing advantages in large part by moving the discrete wiring of the prior art panels, such as that illustrated in FIG. 2, from the back of the panel to a circuit board style conductive wiring trace, or pattern, that is formed directly on the face of the substrate and/or structural panel through a "direct write" manufacturing method. Surface mount micro LEDs or OLEDs are then covered by clear and/or decorative laminates ("declams") comprising thin, flexible films, such as Du Pont Tedlar polyvinyl fluoride (PVC). The declam is provided with small apertures, or "vias" through which the light sources are respectively exposed.

As may be seen by reference to FIG. 2, the prior art lighting panel 100 has all of the components installed on the back, or non-decorative surface. The method by which the holes are made for the light sources (LEDs) to shine through is a high ergonomic risk process. By contrast, the panels of the present disclosure have most of the components disposed on the front, or decorative surface of the panel, and covered by a decorative laminate, such that only the wire bundle connection, and in one possible embodiment, a small microprocessor control chip, are located on the non-decorative surface. The bulky, complex wiring on the back side of the panel is thus eliminated or greatly reduced, thereby reducing the weight and volume of the panel.

Figure 3A:
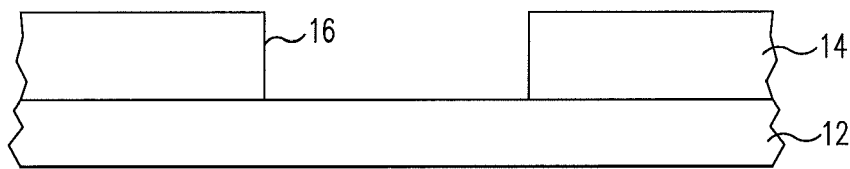
FIGS. 3A-3F are partial cross-sectional views of an exemplary embodiment of a Starry Sky aircraft ceiling lighting panel or appliqué therefor in accordance with the present disclosure, showing sequential processes of an exemplary embodiment of a method for manufacturing the panel.

FIGS. 3A-3F are partial cross-sectional views of one exemplary embodiment of a Starry Sky aircraft ceiling lighting panel 10 in accordance with the present disclosure, showing sequential processes involved in an exemplary method for manufacturing the panel. As illustrated in FIG. 3A, lower and upper flexible base substrates 12 and 14 are provided, the upper one having small perforations or through-openings 16 formed at each desired LED location 16 in the panel. In one embodiment, the two base substrates 12 and 14 may each comprise a polyvinyl fluoride (PVF) material, such as Tedlar film, made by Du Pont. Of course, other strong, flexible, dielectric substrate materials may also be employed for these substrates, e.g., Kapton, Mylar or polyvinyl chloride (PVC) materials. Additionally, in an appropriate case, the lowermost base substrate 12 may comprise an existing aircraft structural ceiling panel, made of, e.g., a polycarbonate or polyurethane plastic, with the lighting laminations described below being built up on a down-ward facing, or decorative surface thereof.

The openings 16 in the upper base substrate 14 may be formed in a variety of ways, for example, by laser ablation.

Figure 3B:
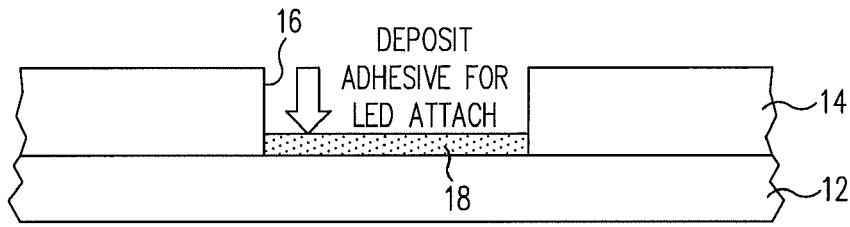
Figure 3C:
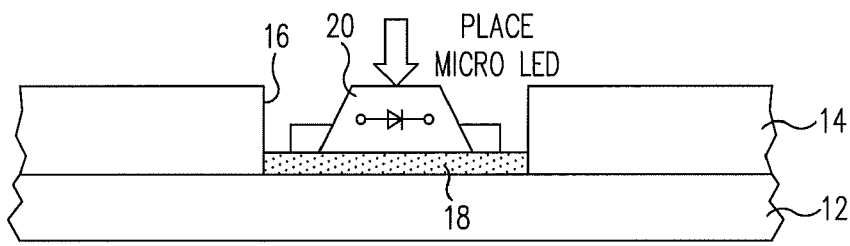

As illustrated in FIG. 3A, the upper base substrate 14 containing the openings 16 is bonded or laminated to an upper surface of the lower base substrate 12 so as to form a plurality of recesses with closed bottoms. As illustrated in FIG. 3B, an adhesive 18 is then placed at the bottom of each opening. Then, as illustrated in FIG. 3C, a microminiature light source, e.g., an LED 20, is placed onto the adhesive in each of the openings, for example, using a conventional pick-and-place machine (not illustrated).

Figure 3D:
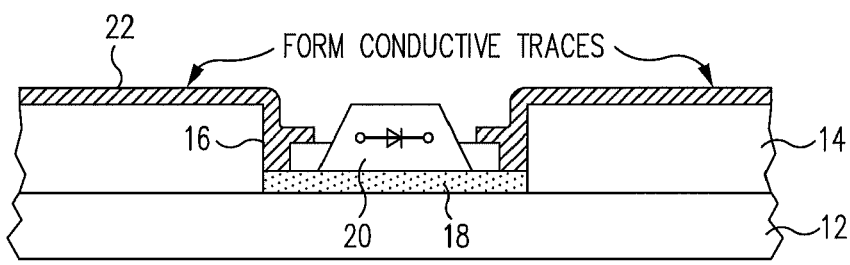

As illustrated in FIG. 3D, electrically conductive circuit traces 22 are then "written" over the top surface of the upper substrate 14 so as to make electrical connections with the respective leads, i.e., the anode and cathode, of each of the LEDs 20. As discussed below, the conductive traces 22 electrically interconnect the LEDs 20 with the power and control circuitry of the panel 10 such that each LED can be controlled independently of the others, i.e., caused to blink or "twinkle." Alternatively, groups of associated LEDs in the panel can be controlled independently of each other.

In an alternative embodiment (not illustrated), the light sources 20 can be mounted on the upper surface of the lower substrate 12 and then interconnected by writing the conductive traces 22 over the top surface of the lower substrate 12 before the upper substrate 14 is bonded thereto. The upper substrate can then be laminated over the lower substrate, conductive traces and light sources such that each light source is received in a respective opening 16 of the upper substrate.

Figure 3E:
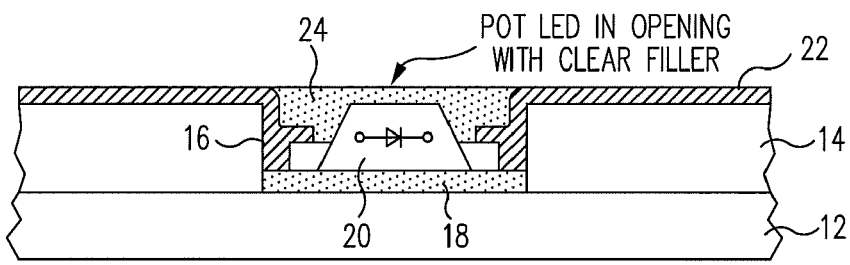

As illustrated in FIG. 3E, each LED 20 is potted in its respective opening 16 by depositing a clear filler material 24 around the LED so as to fill any gaps around it and thereby "planarize" it, i.e., provide a relatively smooth upper surface on the laminate in the area of the LED. The resulting substrate-LED assembly may then be cured, e.g., by UV radiation, if UV curing adhesives are used, or alternatively, may be co-cured with an underlying aircraft structural ceiling panel 12 with heat, e.g., in a crush core or autoclave process.

Figure 3F:
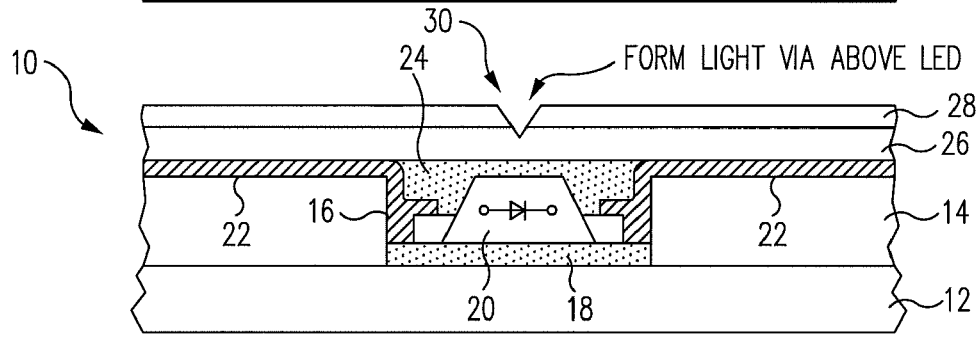

As illustrated in FIG. 3F, a clear film 26, e.g., Tedlar or the like, is then installed over the laminate, followed by a final decorative film (declam) having a desired color and/or decorative pattern. Small apertures or vias 30 are then cut through the decorative Tedlar to provide a light emitting opening at each micro LED 20. As discussed above, the resulting laminate may then be bonded to the decorative side of an aircraft structural ceiling panel (not illustrated) in the form of an appliqué, or alternatively, as described below, if the lower base substrate 12 comprises such a panel, the lighting panel is substantially complete. As those of skill in the art will appreciate, the latter embodiment, i.e., one in which the laminations 14, 26 and 28 are built up directly on an existing structural ceiling panel 12, is effective in minimizing weight, by virtue of the elimination of the first base substrate 12.

As those of skill in the art will also appreciate, there are numerous other fabrication and assembly options available that will arrive at the same or a substantially similar lighting panel 10 configuration. For example, the flexible upper substrate 14 may include a "flap" (not illustrated) located at an edge of the panel 10, upon which terminal ends of the circuit traces 22 are written, and that is arranged to wrap around the edge of the panel to the back side thereof so as to provide a location thereat for the installation of the power and control electronics of the panel. This "wraparound circuit board" may then be populated by either bonding the electronic components to the substrate and then writing interconnecting conductive traces 16 upon their respective leads, or by printing the circuit traces onto the upper substrate 14 and then attaching the electronics thereto using, e.g., conductive adhesives. It should also be noted that the direct-write manufacturing techniques contemplated herein and described below are capable of printing many of the necessary passive electronic power and control components themselves, such as resistors, capacitors, antennas, ground planes, shielding, and the like, thereby minimizing the number of discrete components utilized in the lighting panel 10.

Figure 4:
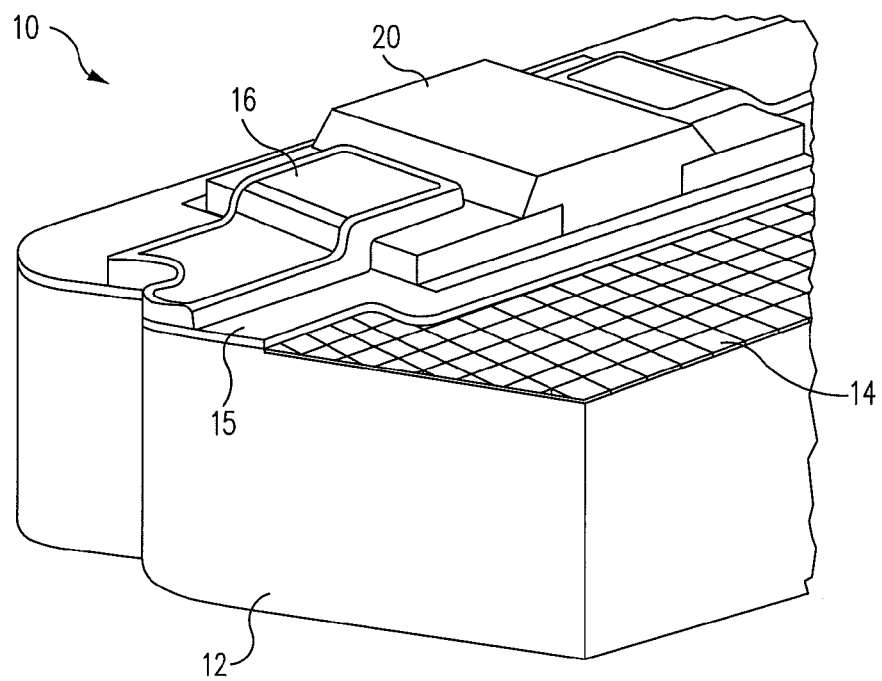
FIG. 4 is a partial cross-sectional perspective view of a single, surface-mounted and electrically interconnected microminiature LED of another embodiment of an aircraft ceiling lighting panel in accordance with the present disclosure.

FIG. 4 illustrates another exemplary embodiment of a lighting panel 10 comprising a lamination buildup made directly on the decorative side of an aircraft structural ceiling panel 12, e.g., a honeycomb-structure panel. In this embodiment, the decorative side of the panel comprises a carbon fiber composite skin 14. Since the carbon fiber material is electrically conductive, one or more dielectric films 15 are first printed over the composite skin 14 of the panel in those regions that will later have conductive elements, e.g., conductive traces 16 and electrical components 20, attached thereto. It should be noted that this step is only necessary when printing on electrically conductive panels 12, such as those containing metallic or carbon fiber skins, and may be omitted where the underlying structural panel 12 is non-conductive.

A plurality of tiny light sources, e.g., microminiature LEDs 20, are then bonded to the upper surface of the structural panel 12, and conductive traces 16 are then written on the upper surface of the structural panel 12 so as to form electrical interconnections with the leads of the LEDs 20. At this point, a filler material 24 (not shown in FIG. 4) may be dispensed around the periphery of each LED so as to taper the high points of the LEDs and conductive traces 16 down to the panel upper surface and thereby planarize it so as to prevent "markoffs," i.e., small discontinuities in the upper surface which are perceived as blemishes, when a decorative film 28 (not shown in FIG. 4) is then laminated over the panel surface. The final decorative laminate (not illustrated) is then laminated over the panel surface and LEDs, and small light vias 30 are made therein at locations corresponding to each of the micro LEDs.

Figure 5:
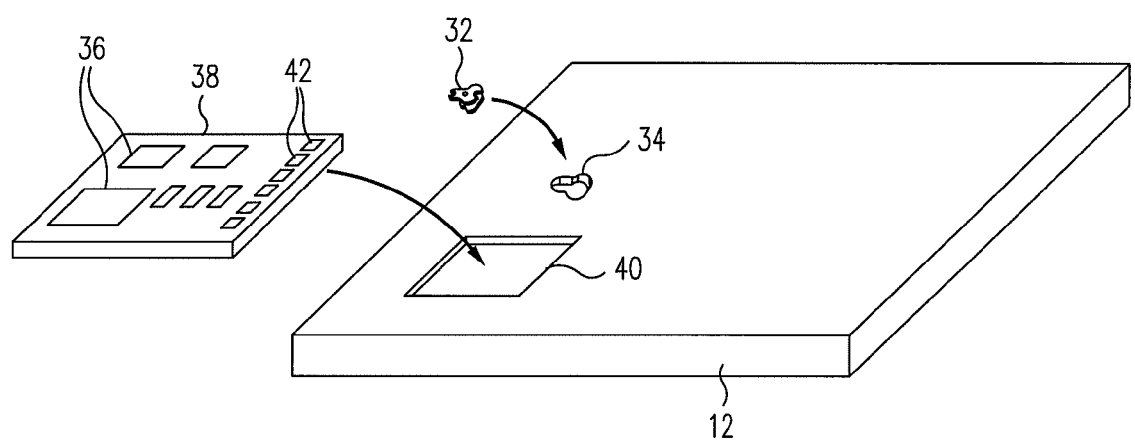
FIG. 5 is a partial perspective view of another exemplary embodiment of a Starry Sky lighting panel, showing an LED insert and a pre-assembled block containing embedded discrete electronic components required for operation of the panel being potted into respective cavities formed in a decorative side of the panel and prior to being written with conductive trace interconnects.
Figure 6:
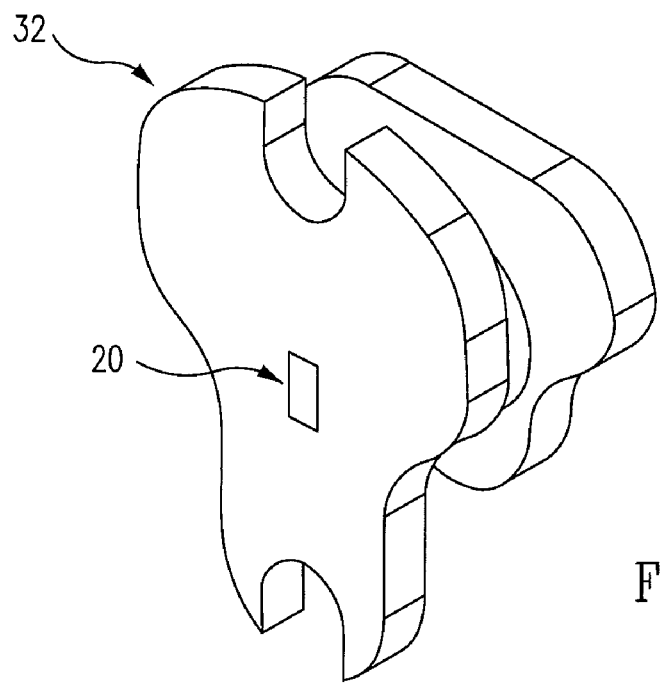
FIG. 6 is a perspective view of a microminiature LED insert of another aircraft ceiling lighting panel in accordance with the present disclosure; and, FIG. 7 is a partial diagrammatic perspective view of an exemplary lighting panel coupling electrical power from an adjacent ceiling wash light assembly by means of a "pigtail" or jumper wire bundle extending between the panel and the wash light.

As illustrated in FIG. 5, it is possible to eliminate the need for a filler or potting material 24 around the LEDs 20, used to reduce markoffs as described above, by incorporating the LEDs 20 within panel inserts 32 that are respectively bonded into predrilled recesses 34 in the structural panel 12 so as to be flush with the upper surface thereof, and then writing the conductive traces 16 directly on the panel surface so as to electrically interconnect the LED inserts. As illustrated in FIG. 6, the inserts 32 may be configured to be non-symmetrical in shape to help ensure correct orientation and electrical polarity of the associated LEDs 20 when installed in the panel 12.

As further illustrated in FIG. 5, in yet another exemplary embodiment, other discrete electrical components 36, e.g., microprocessors and RF control components required to power and control the LEDs 20 of the panel 10, can be embedded into a pre-assembled block module 38, which may then be potted into a corresponding cavity 40 formed into the decorative side of the panel 12. The power and control component module 38 may incorporate terminal input/output connection pads 42 that enable easy electrical interconnection between the component block and the LEDs 20 via the written conductive traces 16.

As in the above embodiments, after the conductive trace interconnects 16 have been written between the contact pads 42 of the power and control module 38 and the respective terminals of the LEDs 20, the upper surface of the panel 12, including the power and control module and the LEDs, may then be covered over with a decorative laminate film (not illustrated), with the declam being penetrated with vias over each of the LEDs to form light openings, as described above.

In each of the exemplary embodiments herein, one or more of several direct conductive trace 16 "writing" methods may be used:

1. "Plasma spraying" may be used to deposit a wide range of conductive or non-conductive materials directly onto conformal surfaces. This "direct write" technology is available through, for example, Mesoscribe Technologies of Stony Brook, N.Y.;

2. "Aerosol Spraying" also can also be used to deposit a wide range of materials with extremely fine (4-5 micron) feature size, either on flat substrates or on conformal surfaces. This technology is available through, for example, Optomec, of Albuquerque, N. Mex.;

3. "Ink jet printing" technology, which is available from a wide variety of vendors, may also be used to print to flat substrates, which may then be adhered to conformal surfaces.

Figure 7:
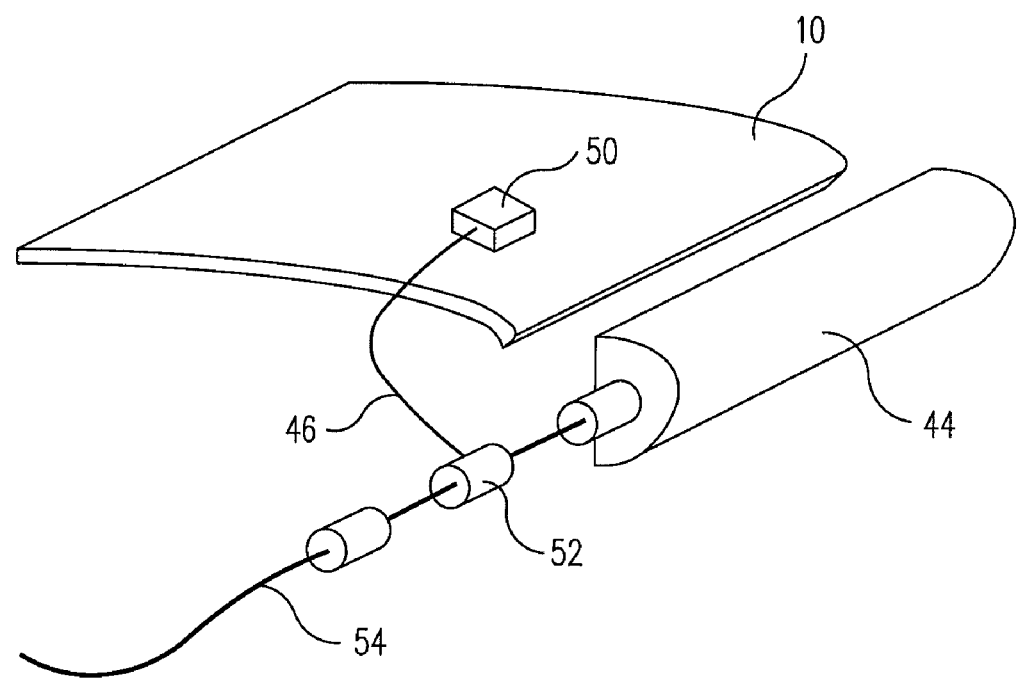

As those of skill in the art will appreciate, many aircraft LED lighting systems provide electrical power and a control signal to light fixtures, such as conventional ceiling wash light fixtures 44, of the type illustrated in FIG. 7. Electronics located within the fixture then control the color and brightness of the emitted light. Pulse width modulation is typically used to control the brightness of each LED within the fixture. Furthermore, each light fixture may be individually controlled. Since the ceiling wash lights are typically disposed in a low-power state while the Starry Sky ceiling panels are on so as to reduce the overall ambient light in the aircraft cabin, the electrical power needed to drive the Starry Sky panels 10 may be drawn from the ceiling wash light assemblies 44 as illustrated in FIG. 7, without the need for additional wiring of the aircraft.

In FIG. 7, a "pigtail" or jumper bundle 46 that conveys electrical power and/or control/brightness settings from the ceiling wash light fixture 44 to a lighting panel control module 50 associated with the panel 10 may have a simple pass-through connector 52 that splices into and couples off power from the power line 54 of the existing wash light fixture. As will be appreciated, a ceiling wash light 44 operating in a "night mode" and in combination with an associated Starry Sky panel 10 will require substantially less total power than that which the light fixture consumes in other operating modes. Further, the Starry Sky ceiling panel 10 may tap only electrical power (in conjunction with a wireless, i.e., RF, control interface), or alternatively, may tap into both power and lighting control, with the cabin lighting control software being modified to accommodate the control of the Starry Sky lighting panel 10 as well as the existing fixture 44.

In an alternative embodiment, it is also possible (in a suitably configured aircraft) to distribute electrical power and control signals to the Starry Sky ceiling panels 10 through conductive aircraft structure disposed adjacent to the panels or to which they are directly attached.

Control over the Starry Sky lighting panels 10 (typically involving overall star field brightness and blink rate) may be effected, for example, by the following techniques:

1. Transmitting control commands or settings from the aircraft to the panel via a wireless link. In this embodiment, the panels 10 each includes a radio receiver that receives such commands or settings. As discussed above, the radio's antenna may be printed directly on the panel or on a substrate laminated thereto, along with other electrical conductors and components. Several wireless control architectures are feasible, and this option is particularly advantageous for retrofit installations, because it eliminates or substantially reduces the need for re-wiring of the aircraft to accommodate the panels.

2. Transmitting control commands or settings from the airplane to the panel via communication over power line (COPL) technology. In this embodiment, the electronics of the aircraft superimpose the panel 10 control/setting signals over the power signal coupled off to the panel, as described above. A COPL transceiver 50 located on the panel then interprets these signals and controls the light sources of the panel in accordance therewith.

As those of skill in the art will appreciate, the improved Starry Sky lighting panels 10 of the present invention offer a number of advantages over the lighting panels 100 of the prior art. The components of the Starry Sky panels 10 are less expensive (excluding investment in capital equipment). The current manufacturing process has high ergonomic cost factors, including fine detail, repetitive motions, and the like, which are substantially eliminated in the exemplary embodiments disclosed herein.

Additionally, the integration of "direct write" electronics and conductive traces 16 into the Starry Sky panels 10 herein has several additional benefits, including reduced panel weight, shorter process flow times, improved durability, a more efficient form factor and improved ergonomics of manufacture. Indeed, in the past, some aircraft customers have not selected the Starry Sky lighting option because of the weight penalty associated therewith. The novel lighting panels 10 described herein provide a weight savings of about 3 lbs. per panel, which, in an aircraft equipped with about 70 such panels, results in an appreciable weight savings over the prior art panels 100 of FIG. 2.

Further, as described above, in some embodiments, the panels 10 may have a "wired" supply of electrical power and a "wireless," e.g., radio, interface for communication and control. Thus, the novel Starry Sky panels require only a low voltage electrical interface for power. Since the panels typically draw very little power to begin with, power can be tapped from existing sources, such as ceiling wash lights, which are typically turned down to low power while the starry sky effect is operating. Tapping power from local sources and providing wireless control greatly simplifies retrofit of existing aircraft by reducing the need to run additional aircraft wiring.

While the various exemplary lighting panel embodiments disclosed herein are described and illustrated in the context of aircraft interior ceiling lighting systems, it will be evident that they are not limited to this particular application, but may be use in a variety of other applications, e.g., other aircraft surfaces, such as entry area ceilings, destination spaces, or even in non-aerospace applications, such as dance halls, theaters, residential ceilings, and the like.

Indeed, as those of skill in this art will by now appreciate, many modifications, substitutions and variations can be made in the applications, materials, methods and implementations of the Starry Sky lighting panels of the present invention without departing from its spirit and scope. In light of this, the scope of the present invention should not be limited to that of the particular embodiments illustrated and described herein, as they are only by way of some examples thereof, but instead, should be fully commensurate with that of the claims appended hereafter and their functional equivalents.

What is claimed is:

1. A vehicle interior lighting panel, comprising:
a first substrate;
a plurality of surface-mounting light sources mounted on an upper surface of the first substrate;
a plurality of electrically conductive traces written directly onto the upper surface of the first substrate or a non-conductive layer disposed thereon and onto upper surfaces of leads of the light sources such that the writing of the traces simultaneously forms a direct electrical interconnection between selected ones of the traces and associated ones of the light sources;
a clear filler material surrounding each light source; and,
a flexible film laminated directly on the upper surface of the first substrate and light sources, the film containing a plurality of apertures therethrough, each aperture corresponding in location to a respective one of the light sources; and a power and control module insert for supplying electrical power and control signals to the light sources of the panel,
wherein the light sources and the power and control module insert are potted within respective recesses in the upper surface of the first substrate.

2. The lighting panel of claim 1, wherein the light sources comprise light emitting diodes (LEDs) or organic light emitting diodes OLEDs.

3. The lighting panel of claim 1, wherein each of the light sources is disposed within an insert that is configured so as to indicate a polarity of the light source.

4. The lighting panel of claim 1, further comprising a dielectric film disposed on the upper surface of the first substrate and below each of the conductive traces.

5. The lighting panel of claim 1, wherein the first substrate comprises an aircraft structural ceiling panel.

6. The lighting panel of claim 1, wherein the flexible film comprises polyvinyl fluoride (PVF).

7. A method for supplying electrical power to the lighting panel of claim 1, the method comprising:
tapping into an electrical power supply line of an adjacent light fixture;
coupling off an electrical power signal from the supply line and into a jumper wire coupled between the light fixture and the light panel; and,
powering the lighting panel through the jumper wire with the coupled off power signal when the light fixture is operating in a powered-down mode.

8. The method of claim 7, further comprising:
superimposing lighting panel light source control and setting signals on the power signal coupled to the lighting panel; and,
providing the lighting panel with a communication over power line (COPL) transceiver capable of interpreting the lighting panel control and setting signals and controlling the light sources of the panel in accordance therewith.

9. A method of controlling the light sources of the lighting panel of claim 1, the method comprising:
providing the lighting panel with a radio receiver; and,
transmitting lighting panel light source control and setting command signals to the panel via a wireless link between the vehicle and the radio receiver.

10. The lighting panel of claim 1, wherein the flexible film comprises a decorative film (declam).

* * * * *